United States Patent
Fuentes et al.

(10) Patent No.: US 11,770,322 B1
(45) Date of Patent: Sep. 26, 2023

(54) ELECTRONIC CIRCUIT TO COMMUNICATE INFORMATION AS AN ELECTRICAL CURRENT ON TWO WIRES SUCH THAT THE ELECTRICAL CURRENT IS STABILIZED BY MEASURING A VOLTAGE ON A TRANSISTOR WITHIN THE ELECTRONIC CIRCUIT

(71) Applicant: Allegro MicroSystems, LLC, Manchester, NH (US)

(72) Inventors: Leandro Fuentes, Caba (AR); Manuel Rivas, Buenos Aires (AR); Ezequiel Rubinsztain, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 48 days.

(21) Appl. No.: 17/661,311

(22) Filed: Apr. 29, 2022

(51) Int. Cl.
*H04L 43/50* (2022.01)
*G01R 33/07* (2006.01)
*G01R 33/06* (2006.01)

(52) U.S. Cl.
CPC ............ *H04L 43/50* (2013.01); *G01R 33/066* (2013.01)

(58) Field of Classification Search
CPC ...... G01R 33/06; G01R 33/066; G01R 35/02; H04L 1/24; H04L 1/242; H04L 1/243; H04L 1/248; H04L 43/50
USPC .......................... 375/219–221, 224, 226–227
See application file for complete search history.

(56) References Cited

U.S. PATENT DOCUMENTS

| | | | | |
|---|---|---|---|---|
| 3,577,176 A | * | 5/1971 | Kreithen ................... | H02P 8/12 318/432 |
| 4,218,647 A | * | 8/1980 | Haas ........................ | H02H 9/02 361/18 |
| 4,380,088 A | * | 4/1983 | Lipcon .................... | H04L 43/50 714/33 |
| 4,384,363 A | * | 5/1983 | Lipcon .................... | H04L 43/50 370/445 |
| 4,450,571 A | * | 5/1984 | Hirayama ................. | H04L 5/16 375/340 |
| 5,153,466 A | * | 10/1992 | Stein .................... | H04L 25/0286 326/89 |
| 5,220,207 A | * | 6/1993 | Kovalcik ................ | G05F 1/561 327/63 |
| 5,489,846 A | * | 2/1996 | Li .......................... | G01R 33/06 324/252 |
| 5,502,445 A | * | 3/1996 | Dingwall ............... | G01S 13/767 342/51 |
| 5,686,894 A | * | 11/1997 | Vig ........................ | G01D 5/145 377/21 |
| 6,516,024 B1 | * | 2/2003 | Dupuis ............... | H04M 19/001 375/220 |
| 6,529,421 B1 | * | 3/2003 | Marr ..................... | G11C 11/417 365/189.11 |

(Continued)

OTHER PUBLICATIONS

Allegro MicroSystems Datasheet "ATS19480 Large Air Gap, GMR Transmission Speed Sensor IC for Gear Tooth Sensing", Jul. 7, 2021, 14 pages.

(Continued)

*Primary Examiner* — James M Perez
(74) *Attorney, Agent, or Firm* — DALY, CROWLEY, MOFFORD & DURKEE, LLP (57) ABSTRACT

A two-wire electronic circuit can sense a voltage across terminals of a transistor and control an electrical current of the two-wire electronic circuit in accordance with the sensed voltage.

21 Claims, 6 Drawing Sheets

(56) References Cited

U.S. PATENT DOCUMENTS

| | | | | |
|---|---|---|---|---|
| 6,704,050 | B1* | 3/2004 | Washkurak | H04N 25/75 |
| | | | | 348/241 |
| 6,922,134 | B1* | 7/2005 | Yones | B60C 23/0408 |
| | | | | 340/10.51 |
| 6,980,084 | B1* | 12/2005 | Yones | G06K 19/0723 |
| | | | | 340/447 |
| 6,995,606 | B2* | 2/2006 | Bilotti | H03H 11/04 |
| | | | | 327/552 |
| 7,075,287 | B1* | 7/2006 | Mangtani | H01L 24/37 |
| | | | | 324/117 H |
| 7,260,371 | B1* | 8/2007 | Yones | H04W 52/42 |
| | | | | 455/186.1 |
| 8,022,775 | B2* | 9/2011 | Julstrom | H02J 50/402 |
| | | | | 331/25 |
| 8,054,071 | B2* | 11/2011 | Doogue | G01R 33/07 |
| | | | | 324/207.2 |
| 8,093,670 | B2* | 1/2012 | Taylor | H01L 28/40 |
| | | | | 257/427 |
| 8,122,159 | B2* | 2/2012 | Monreal | G06F 13/37 |
| | | | | 710/9 |
| 8,583,111 | B2* | 11/2013 | Burgener | H01P 1/15 |
| | | | | 323/271 |
| 8,773,123 | B2* | 7/2014 | Doogue | G01R 33/09 |
| | | | | 324/207.2 |
| 9,621,140 | B1* | 4/2017 | Fernandez | G01R 33/0023 |
| 9,762,139 | B2* | 9/2017 | Zhang | H02M 7/217 |
| 9,928,194 | B2* | 3/2018 | Ross | G06F 13/404 |
| 10,355,876 | B2* | 7/2019 | Kishigami | H04L 12/40 |
| 10,725,122 | B2* | 7/2020 | Rubinsztain | G08B 21/185 |
| 10,908,230 | B2* | 2/2021 | Rubinsztain | G01R 33/0023 |
| 10,948,537 | B2* | 3/2021 | Forrest | G01R 31/2829 |
| 2001/0004236 | A1* | 6/2001 | Letkomiller | B60C 23/20 |
| | | | | 340/595 |
| 2002/0122438 | A1* | 9/2002 | Enam | H03L 7/0896 |
| | | | | 370/518 |
| 2004/0184517 | A1* | 9/2004 | Westfield | G01D 11/245 |
| | | | | 375/219 |
| 2004/0189221 | A1* | 9/2004 | Kurosawa | H02P 6/28 |
| | | | | 318/400.04 |
| 2006/0113972 | A1* | 6/2006 | Mihara | G05F 1/575 |
| | | | | 323/273 |
| 2007/0200590 | A1* | 8/2007 | Lalithambika | G01R 19/0092 |
| | | | | 324/133 |
| 2008/0096490 | A1* | 4/2008 | Okazaki | H04B 1/403 |
| | | | | 455/76 |
| 2012/0106219 | A1* | 5/2012 | Okuda | H01L 27/0222 |
| | | | | 363/127 |
| 2013/0181723 | A1* | 7/2013 | Mauder | G01R 19/0092 |
| | | | | 324/130 |
| 2016/0049857 | A1* | 2/2016 | Zhang | H02M 7/217 |
| | | | | 363/127 |
| 2017/0153996 | A1* | 6/2017 | Ross | H04L 12/40032 |
| 2018/0041358 | A1* | 2/2018 | Kishigami | H04L 12/40 |
| 2018/0135408 | A1* | 5/2018 | Cooley | G01V 11/002 |
| 2018/0224873 | A1* | 8/2018 | Motz | G05F 3/30 |
| 2019/0204889 | A1* | 7/2019 | Kaeriyama | H02P 29/68 |
| 2020/0007088 | A1* | 1/2020 | Ranta | H03F 3/213 |
| 2020/0025837 | A1* | 1/2020 | Rubinsztain | G08B 21/185 |
| 2020/0028345 | A1* | 1/2020 | Roy | H02H 3/38 |
| 2020/0309866 | A1* | 10/2020 | Rubinsztain | G01R 33/0023 |
| 2021/0165038 | A1* | 6/2021 | Forrest | G01R 31/2851 |
| 2022/0321809 | A1* | 10/2022 | Myers | H03F 3/45475 |
| 2022/0321810 | A1* | 10/2022 | Myers | H03F 3/08 |
| 2022/0321811 | A1* | 10/2022 | Myers | G01J 1/44 |
| 2023/0187922 | A1* | 6/2023 | Randazzo | H03K 19/20 |
| | | | | 361/87 |
| 2023/0255016 | * | 8/2023 | Vimercati | H10B 53/20 |
| | | | | 365/149 |

OTHER PUBLICATIONS

Allegro MicroSystems Datasheet "A19200 ASIL-Compliant Wheel Speed Sensor IC", March 25, 2021, 12 pages.

* cited by examiner

ELECTRONIC CIRCUIT TO COMMUNICATE INFORMATION AS AN ELECTRICAL CURRENT ON TWO WIRES SUCH THAT THE ELECTRICAL CURRENT IS STABILIZED BY MEASURING A VOLTAGE ON A TRANSISTOR WITHIN THE ELECTRONIC CIRCUIT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to an electronic circuit and, more particularly, to an electronic circuit operable to communicate information as an electrical current on two wires such that the electrical current is stabilized by measuring a voltage on a transistor within the electronic circuit.

BACKGROUND

Some two-wire electronic circuits operate such that a voltage is supplied to the two-wire electronic circuit from outside of the two-wire electronic circuit, wherein the voltage is supplied on one of two wires and the second wire operates as a return. In two-wire electronic circuits, the same two wires can be used to communicate information (e.g., digital data) from the two-wire electronic circuit to outside of the two-wire electronic circuit by way of two or more electrical current states (i.e., current values) generated by the two-wire electronic circuit. The electric current states can be sensed outside of the electronic circuit.

In two-wire electronic circuits, it is desirable to provide the electrical current states with known, repeatable, and stable electrical current values. It is desirable that the electrical current values have little or no drift with time, temperature, or other factors.

In two-wire electronic circuits, a functional portion of the two-wire electronic circuit can provide a function beyond that of generating and maintaining the above two or more electrical current states. For example, the functional portion of the electronic circuit may be comprised of a magnetic field sensor having one or more magnetic field sensing elements.

In two-wire electronic circuits that have a functional portion, e.g., a magnetic field sensor portion, it will be recognized that the functional portion of the electronic circuit may use a functional electrical current that can vary with time, temperature, or other factors. It will also be recognized that a current draw of the two-wire electronic circuit can be no lower than the functional electrical current.

Some two-wire electronic circuits (including a functional portion of the electronic circuit) attempt to generate a stable lowest electrical current state (i.e., a lowest electrical current value) that is above the functional electrical current. In some two-wire systems, the stable lowest electrical current value is achieved by generating an additional electrical current within the two-wire electronic circuit, i.e., an additional electrical current beyond the above-described functional electrical current used by the functional portion of the electronic circuit. The additional electronic current can be controlled, thus keeping stable a sum of the additional electrical current and the above-described functional electrical current used by the functional portion of the electronic circuit.

To this end, a conventional controlled two-wire electronic circuit can have a series resistance on or within the two-wire electronic circuit coupled in series with the voltage (i.e., power) received by the two-wire electronic circuit. A voltage drop across the resistance is indicative of a total electrical current used. The voltage drop can be sensed in the two-wire electronic circuit in a feedback arrangement to control the above additional electrical current, thus maintaining a stable total lowest electrical current value of the overall two-wire electronic circuit. However, the above-described series resistance results in undesirable power and voltage loss at the two-wire electronic circuit.

Having a stable lowest electrical current state, other and higher electrical current values (i.e., states) can be generated in two-wire electronic circuits by coupling one or more stable current generators (i.e., current sources or current sinks) in parallel with the electrical current value of lowest electrical current state.

It would be desirable to control a lowest current value (i.e., state) of a two-wire electronic circuit, and therefore, control of higher current values, using a sensing and feedback arrangement, but without using a series resistance.

SUMMARY

The present invention provides control of a lowest current value (i.e., state) of a two-wire electronic circuit, and therefore, control of higher current values, using a sensing and feedback arrangement, but without using a series resistance.

In accordance with an example useful for understanding an aspect of the present invention, an electronic circuit disposed upon a major surface of a semiconductor substrate, can include an electrical current receiving node, the electrical current receiving node operable to receive a state current signal from outside of the electronic circuit. The electronic circuit can also include an electrical current transmitting node, the electrical current transmitting node operable to transmit the state current signal to outside of the electronic circuit. The electronic circuit can also include a first transistor having first and second electrical current passing nodes and operable to pass a first electrical current between the first and second electrical current passing nodes of the first transistor, the first transistor also having a control node operable to control the first electrical current, and the first electrical current passing node of the first transistor coupled to the electrical current receiving node. The electronic circuit can also include voltage reference source operable to generate a predetermined reference voltage, wherein the control node of the first transistor is coupled to receive a voltage related to the predetermined reference voltage. The electronic circuit can also include a second transistor having first and second electrical current passing nodes and operable to pass a second electrical current between the first and second electrical current passing nodes of the second transistor, the second transistor also having a control node operable to control the second electrical current, the second electrical current passing node of the first transistor coupled to the first electrical current passing node of the second transistor, and the second electrical current passing node of the second transistor coupled to the electrical current transmitting node. The electronic circuit can also include a voltage sensing circuit having first and second input nodes and an output node, a voltage at the output node indicative of a voltage difference between the first and second input nodes, the first input node of the voltage sensing circuit coupled to the control node of the first transistor, the second input node of the voltage sensing circuit coupled to the second electrical current passing node of the first transistor, and the output node of the voltage sensing circuit coupled to the control node of the second transistor. The electronic circuit can also include a portion of the electronic circuit coupled to the second electrical current passing node of the first transistor, wherein the portion of the electronic circuit is operable to use a circuit portion electrical current having a circuit portion voltage, wherein the first electrical current includes both the second electrical current and the circuit portion electrical current, wherein the electronic circuit is operable to control the second electrical current to maintain a predetermined sum of the second electrical current and the circuit portion electrical current.

In accordance with another example useful for understanding another aspect of the present invention, a method used in an electronic circuit disposed upon a semiconductor substrate can include receiving, from outside of the electronic circuit, at an electrical current receiving node, a state current signal. The method can also include transmitting, to outside of the electronic circuit, from an electrical current transmitting node, the state current signal. The method can also include conducting, through a first transistor, a first electrical current, the first electrical current being at least a portion of the state current signal. The method can also include measuring a voltage difference between two nodes of the first transistor. The method can also include conducting, in accordance with the voltage difference, through a second transistor, a second electrical current, the second electrical current being a first portion of the first electrical current. The method can also include conducting, to a portion of the electronic circuit, a circuit portion electrical current, the circuit portion electrical current being a second portion of the first electrical current, wherein a sum of the second electrical current and the circuit portion electrical current is a regulated electrical current having one or more predetermined electrical current values.

In accordance with another example useful for understanding another aspect of the present invention, an electronic circuit disposed upon a semiconductor substrate can include means for receiving, from outside of the electronic circuit, at an electrical current receiving node, a state current signal. The electronic circuit can also include means for transmitting, to outside of the electronic circuit, from an electrical current transmitting node, the state current signal. The electronic circuit can also include means for conducting, through a first transistor, a first electrical current, the first electrical current being at least a portion of the state current signal. The electronic circuit can also include means for measuring a voltage difference between two nodes of the first transistor. The electronic circuit can also include means for conducting, in accordance with the voltage difference, through a second transistor, a second electrical current, the second electrical current being a first portion of the first electrical current. The electronic circuit can also include means for conducting, to a portion of the electronic circuit, a circuit portion electrical current, the circuit portion electrical current being a second portion of the first electrical current, wherein a sum of the second electrical current and the circuit portion electrical current is a regulated electrical current having one or more predetermined electrical current values.

BRIEF DESCRIPTION OF THE DRAWINGS

The foregoing features of the invention, as well as the invention itself may be more fully understood from the following detailed description of the drawings, in which.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses one or more magnetic field sensing elements (part of an electronic circuit) in combination with another electronic circuit portion, all disposed upon a common substrate, e.g., a semiconductor substrate. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field signal" is used to describe any circuit signal that results from a magnetic field experienced by a magnetic field sensing element.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in one or more application specific integrated circuits (ASICs), which can be analog ASICs or digital ASICs. In some embodiments, the "processor" can be embodied in one or more microprocessors with associated program memory. In some embodiments, the "processor" can be embodied in one or more discrete electronic circuits, which can be analog or digital.

As used herein, the term "module" can be used to describe a "processor." However, the term "module" is used more generally to describe any circuit that can transform an input signal into an output signal that is different than the input signal.

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks (e.g., processors or modules), it will be understood that the analog blocks can be replaced by digital blocks (e.g., processors or modules) that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction that is used in the operation of the active component. A transistor, a diode, and a logic gate are examples of active electronic components. In contrast, as used herein, the term "passive electronic component" as used to describe an electronic component that does not have at least one p-n junction used in operation of the passive electronic circuit. A capacitor and a resistor are examples of passive electronic components.

As used herein, the term "amplifier" is used to describe a circuit element with a gain greater than one, less than one, or equal to one.

As used herein, the terms "line" and "linear" are used to describe either a straight line or a curved line. The line can be described by a function having any order less than infinite.

Figure 1:
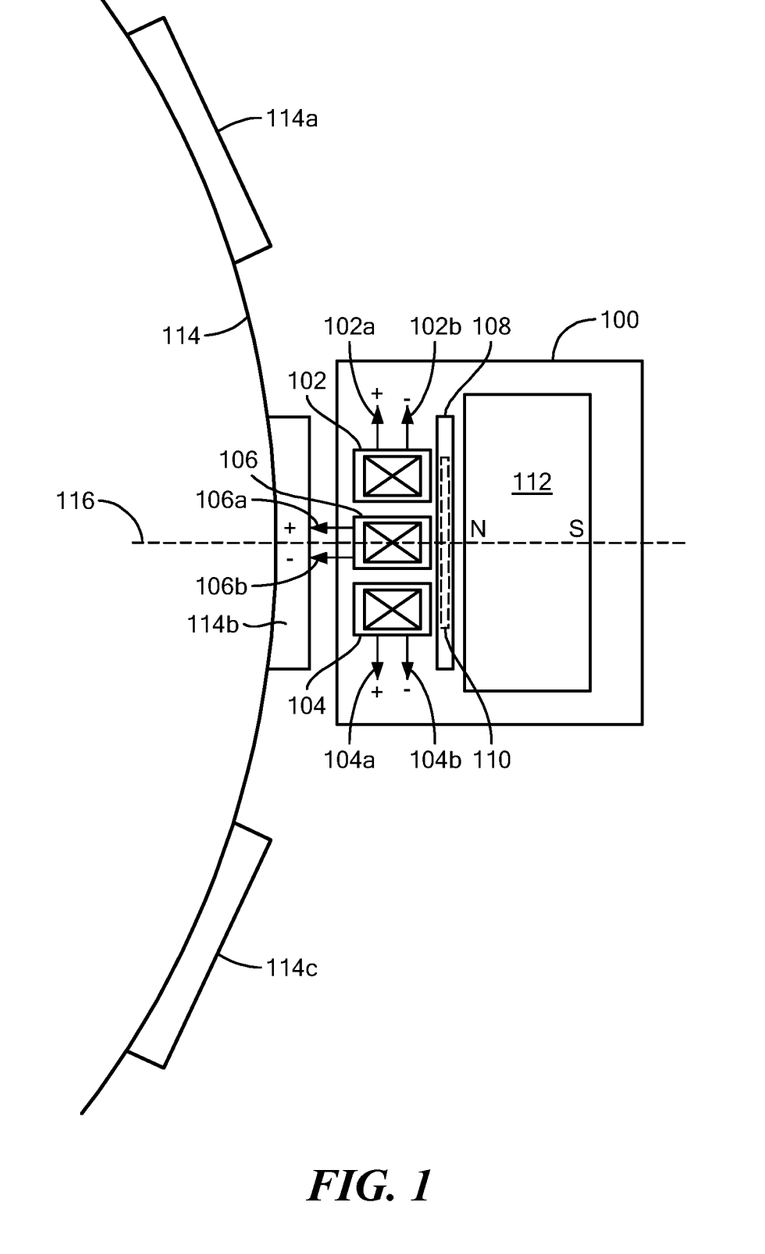
FIG. 1 is a block diagram showing a two-wire electronic circuit having a magnetic field sensor portion.

Referring now to FIG. 1, an example of a two-wire electronic system 100 can include therein a magnetic field sensor portion responsive to a gear 114 having gear teeth, e.g., gear teeth 114a, 114b, 114c. The illustrative two-wire electronic system 100 can include a two-wire electronic circuit 110. The two-wire electronic circuit 110 can include the magnetic field sensor portion having three magnetic field sensing elements 102, 104, 106.

In some embodiments, the magnetic field sensing elements 102, 104 are separated in a direction perpendicular to an axis 116 by a distance between about 1.5 millimeters and about 3.0 millimeters, and the magnetic field sensing element 106 is located midway between the magnetic field sensing elements 102, 104.

The two-wire electronic circuit 110, can be disposed upon (i.e., integrated within or upon) a substrate 108. For clarity, here the magnetic field sensing elements 102, 104, 106 are shown to be Hall elements with an exaggerated size and rotated out of the plane of the substrate 108. Furthermore, for clarity, the Hall elements 102, 104, 106 are shown to be on top of the substrate 108, but it will be appreciated that Hall elements are usually disposed upon or within a surface of a substrate of an integrated circuit.

The two-wire electronic system 100 can also include a magnet 112. The magnet 112 is configured to generate a magnetic field, which is generally directed along an axis 116 at the positions of the three magnetic field sensing elements 102, 104, 106. The magnet can provide a so-called back-biased arrangement.

The two-wire electronic circuit 110 is configured to generate an output signal having a two-wire configuration. Illustrative signals generated by the two-wire electronic circuit 110 are described below in conjunction with FIG. 3.

An output signal, when the gear 114 is rotating, can be indicative of a speed of rotation of the gear 114 and, in some embodiments, can also be indicative of a direction of rotation of the gear 114.

The two-wire electronic circuit 110 uses the three magnetic field sensing elements 102, 104, 106 to generate a respective three internal differential signals 102a, 102b, and 104a, 104b, and 106a, 106b.

Figure 2:
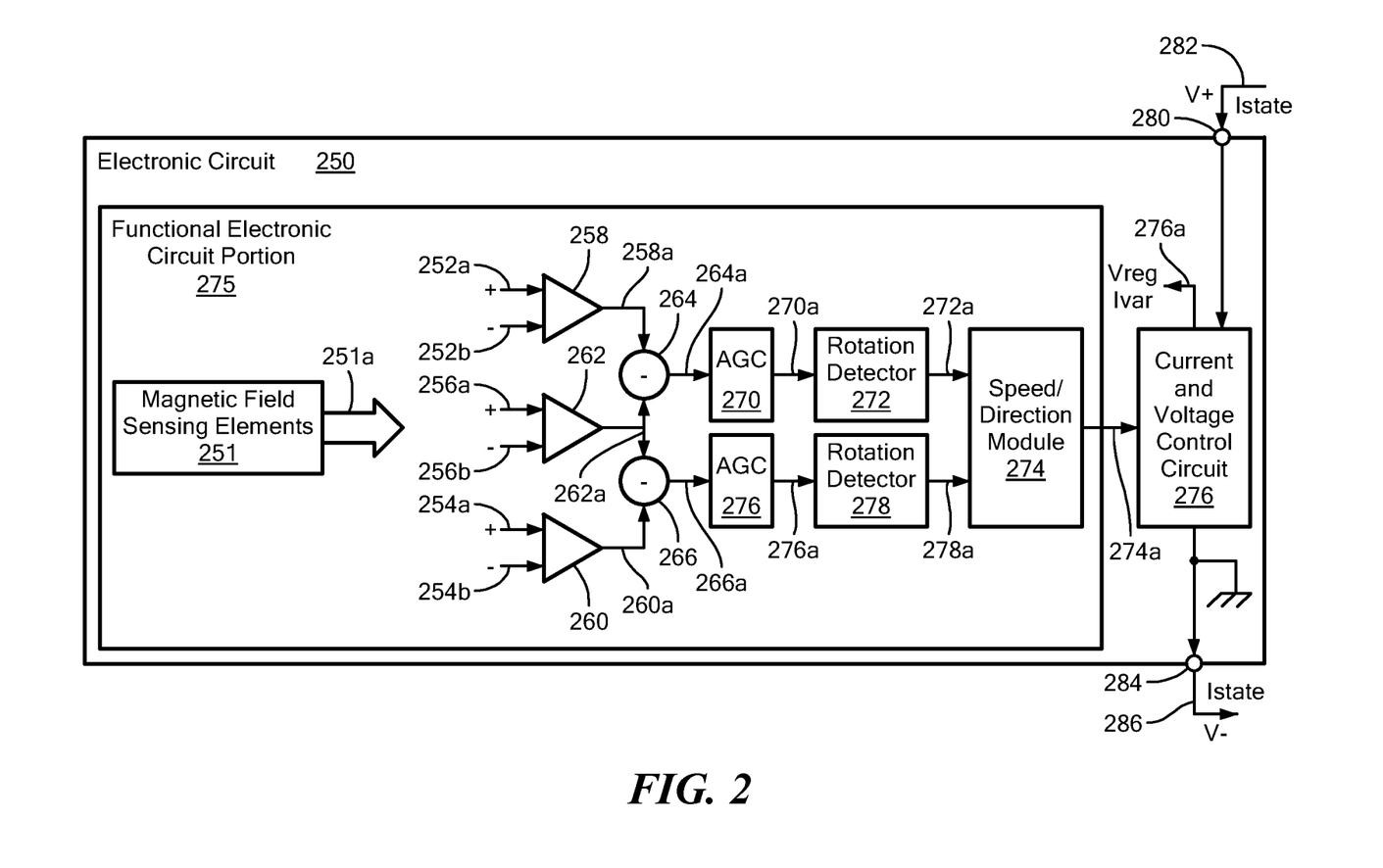
FIG. 2 is a block diagram showing further details of the two-wire electronic circuit of FIG. 1 having the magnetic field sensor portion.

Referring now to FIG. 2, an illustrative two-wire electronic circuit 250 can be the same as or similar to the two-wire electronic circuit 110 of FIG. 1. The two-wire electronic circuit 250 can include a functional electronic circuit portion 275, here shown to provide a magnetic field sensor function. However, other types of functional electronic circuit portions are possible, including functional electronic circuit portions that do not provide a magnetic field sensor function.

The two-wire electronic circuit 250 can also include a current and voltage control circuit 276. The two-wire electronic circuit 250 can include first and second nodes 280, 284 respectively, to which the current and voltage control circuit 276 can be coupled.

Between the first and second nodes 280, 284, the two-wire electronic circuit 250 can receive a voltage, V+, V−, from outside to the two-wire electronic circuit 250. The voltage, V+, V−, can provide power to the two-wire electronic circuit 250.

While the voltage, V+, V−, is received between the first and second nodes 280, 284, the current and voltage control circuit 276 can be operable to control values of a state current signal, Istate, 282, 286 that flows between the first and second nodes 280, 284.

The state current signal, Istate, 282, 286 can be sensed by an electronic circuit (not shown) outside of the two-wire electronic circuit 250. In this way, the current and voltage control circuit 276 can provide one or more electrical currents to the electronic circuit outside the two-wire electronic circuit 250. Values of each one of the one or more electrical currents can be indicative of a respective one or more digital states generated by the two-wire electronic circuit 25 and sensed by the electronic circuit outside the two-wire electronic circuit 250.

The current and voltage control circuit 276 can be further operable to generate a regulated voltage 276a, Vreg, which can provide a power supply voltage to the functional electronic circuit portion 275. A current draw, Ivar, of the functional electronic circuit portion 275 can change with time, temperature, or other factors. However, it will become apparent from discussion below in conjunction with FIG. 4 and others, that the state current signal 282, 286 can have one or more current values that have little or no changes with time, temperature, or other factors.

The functional electronic circuit portion 275 can include three magnetic field sensing elements 251 operable to generate three magnetic field signals 251a. The three magnetic field sensing elements 251 can be the same as or similar to the three magnetic field sensing elements 102, 104, 106 of FIG. 1.

The functional electronic circuit portion 275 can include amplifiers 258, 260, 262 coupled to receive differential signals 252a, 252b, and 254a, 254b, and 256a, 256b, respectively, from the three magnetic field sensing elements 251. The differential signal 252a, 252b can be the same as or similar to the differential signal 102a, 102b, the differential signal 254a, 254b can be the same as or similar to the differential signals 104a, 104b, and the differential signal 256a, 256b can be the same as or similar to the differential signal 106a, 106b generated, respectively, by the magnetic field sensing elements 102, 104, 106 of FIG. 1. The amplifiers 258, 260, 262 are configured to generate amplified signals 258a, 260a, 262a, respectively.

The amplified signals 258a, 262a are received by a first differencing circuit 264, which is configured to generate a first difference signal 264a. The amplified signals 260a, 262a are received by a second differencing circuit 266, which is configured to generate a second difference signal 266a.

The functional electronic circuit portion 275 can include two rotation detector channels. Automatic gain controls (AGCs) 270, 276 can be coupled to receive the difference signals 264a, 266a, respectively, and can be operable to generate gain-controlled signals 270a, 276a, respectively.

A rotation detector 272 can be coupled to receive the gain-controlled signal 270a and can be operable to generate a rotation detector signal 272a. A rotation detector 278 can be coupled to receive the gain-controlled signal 276a and can be operable generate a rotation detector signal 278a. The rotation detector signals 272a, 278a can be as described below in conjunction with FIG. 3. Let it suffice here to say that the gain-controlled signals 270a, 276a can be sinusoids having analog values and the rotation detector signals 272a, 278a can be two state signals having high and low states representative of gear teeth and valleys of the gear 114 of FIG. 1 passing by the magnetic field sensing elements 251. Thus, the rotation detectors 272, 278 can operate as comparators.

Figure 3:
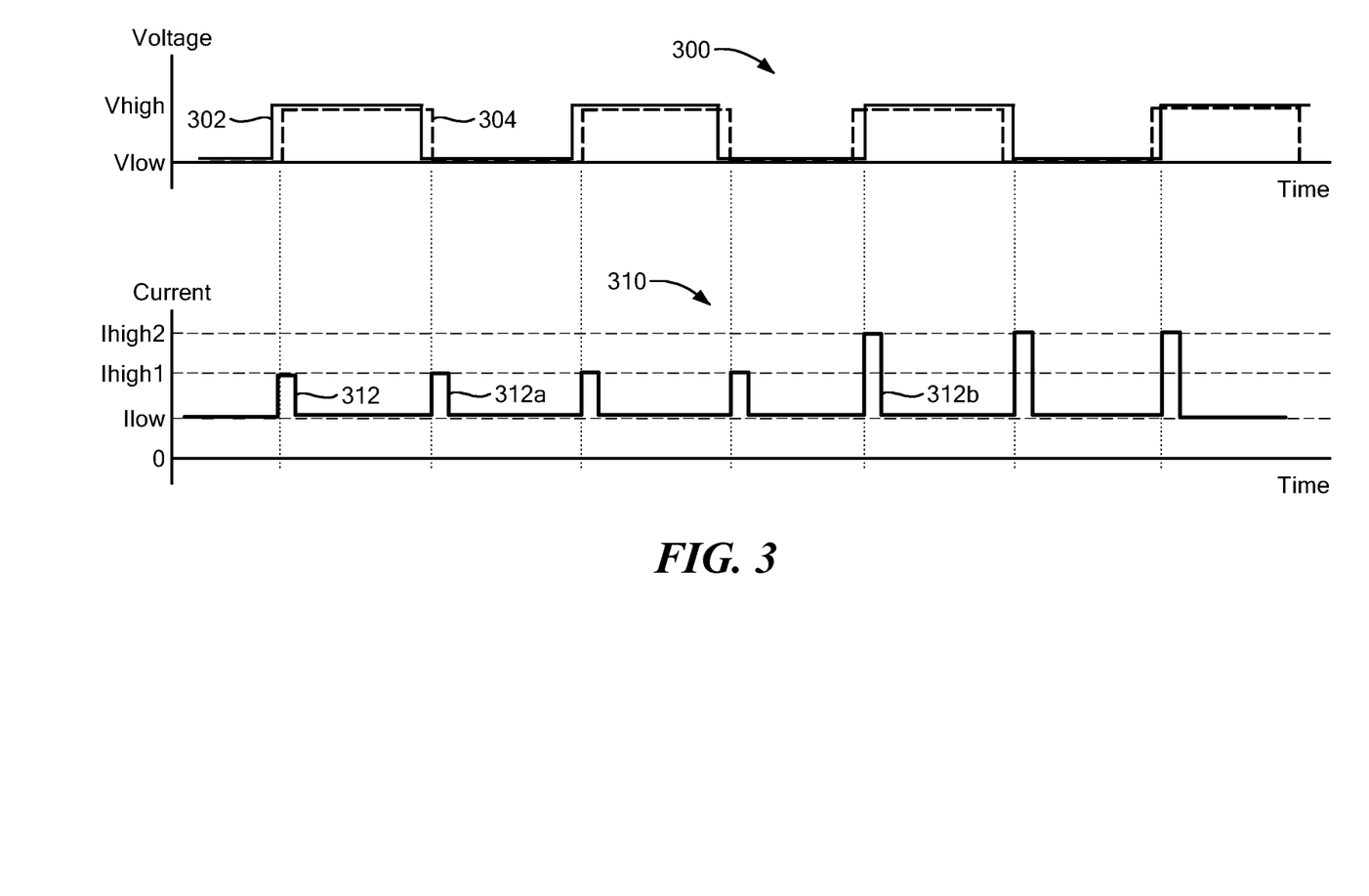
FIG. 3 is a graph showing illustrative signals within the two-wire electronic circuit of FIGS. 1 and 2.

A speed and direction module 274 can be coupled to receive the rotation detector signals 272a, 278a and can be operable to generate a state signal 274a. The state signal can be indicative of one or more digital states. An embodiment described below in conjunction with FIG. 3 is indicative of three such digital states, however, other numbers of states are also possible.

It will become apparent from FIG. 3 below that the rotation detector signals 272a, 278a have relative phases that are in accordance with a direction of rotation of the gear 114. It should also be apparent that rates (e.g., rate of state changes) of the rotation detector signals 272a, 278a are representative of a speed of rotation of the gear 114.

The speed and direction module 274 is configured to generate the state signal 274a that can be representative of at least one of the speed of rotation or the direction of rotation of the gear 114. In some embodiments, the state signal 274a is representative of both the speed of rotation and the direction of rotation.

The current and voltage control circuit 276 can be coupled to receive the state signal 274a. In response to one or more values of the state signal 274a, the current and voltage control circuit 276 can be operable to generate a respective one or more values of the state current signal 282, 286, Istate, thus communicating a respective one or more states of the two-wire electronic circuit 250 to outside of the two-wire electronic circuit 250.

Referring now to FIG. 3, a graph 300 has a horizontal axis with a scale in arbitrary units of time and a vertical axis with a scale in arbitrary units of voltage. A first signal 302 can be the same as or similar to the rotation signal 272a of FIG. 2 and a second signal 304 can be the same as or similar to the second rotation signal 278a.

It should be apparent that the first and second signals 302, 304 can each have a rate of state changes indicative of a speed of rotation of the gear 114 of FIG. 1. It should be further apparent that the first and second signals 302, 304 can have relative phases, the relative phase indicative of a direction of rotation of the gear 114 of FIG. 1.

A graph 310 has a horizontal axis with a scale in arbitrary units of time and a vertical axis with a scale in arbitrary units of electrical current. A signal 312 can be the same as or similar to the state current signal, Istate, 282, 286 of FIG. 2.

The signal 312 can have a first portion 312a with first current states, Ilow, and having second current states, Ihigh1, a state change rate of which is indicative of the speed of rotation of the gear 114 when rotating in a first direction. The signal 312 can have a second portion 312b with the first current states, Ilow, and having third current states, Ihigh2, a state change rate of which is indicative of the speed of rotation of the gear when rotating in a second direction.

From the signal 312, it should be apparent that the above-described circuits outside of the two-wire electronic circuit 250 coupled to receive the state current signal, Istate, 282, 286 of FIG. 2 can sense both the speed of rotation of the gear 114 and also the direction of rotation.

A signal comparable to the state signal 274a of FIG. 2 is not shown in FIG. 3. However, it should be appreciated that the state signal 274a can have one of a variety of signal formats, either serial or parallel.

Figure 4:
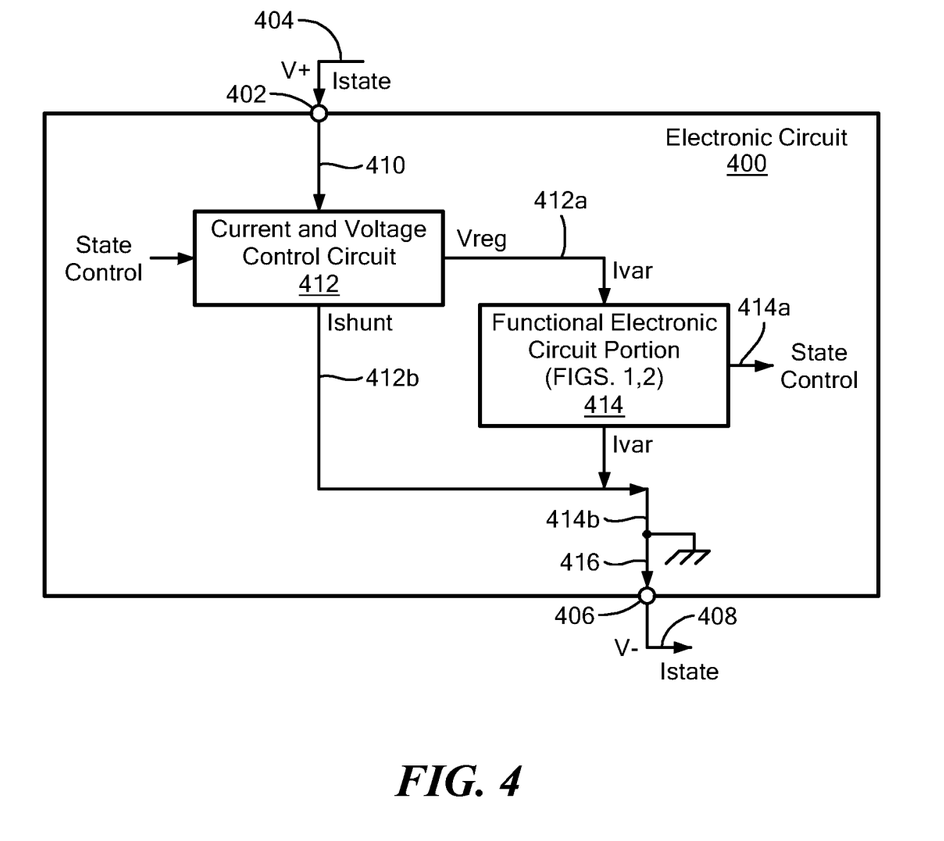
FIG. 4 is a block diagram showing an illustrative two-wire electronic circuit having a current and voltage control circuit.

Referring to FIG. 4, an illustrative two-wire electronic circuit 400 can have first and second nodes 402, 406 comparable to the first and second nodes 280, 284 of FIG. 2. A voltage signals, V+, V−, can be the same as or similar to the voltage signal V+, V−, of FIG. 2. A state current signal, Istate, 404, 408 flowing between the first and second nodes 402, 406 can be the same as or similar to the state current signal, Istate, 282, 286 of FIG. 2.

A current and voltage control circuit 412 can be the same as or similar to the current and voltage control circuit 276 of FIG. 2. The current and voltage control circuit 412 can be operable to generate the state current signal, Istate, 404, 408 having little or no variation with time, temperature, or other factors.

A functional electronic circuit portion 414 (a functional electronic circuit portion) can be the same as or similar to the functional electronic circuit portion 275 of FIG. 2, forming a magnetic field sensor. However, in other embodiments, the functional electronic circuit portion 414 can be another form of functional electronic circuit portion, including a functional electronic circuit portion that does not include magnetic field sensor.

The electronic circuit portion 414 can be operable to generate a state control signal 414a, which can be the same as or similar to the state control signal 274a of FIG. 2. The state control signal 414a can be received by the current and voltage control circuit 412.

In operation, the current and voltage control circuit 412 can be operable to generate a regulated voltage 412a received by the electronic circuit portion 414. The regulated voltage 412a can have a variable current, Ivar, also labelled 412a and 414b, that changes with time, temperature, or other factors. The state current signal, Istate, 404, 408 generated by the current and voltage control circuit 410 is controlled to have one or more current values that have little or no variation with time, temperature, or other factors, even in view of the variable current, Ivar, 412a drawn by the electronic circuit portion 414. In other words, a sum of the variable current, Ivar, 412a, 414b drawn by the electronic circuit portion 414 and a shunt current, Ishunt, 412b controlled by the current and voltage control circuit 412 has current states with values having little or no change with time, temperature, or other factor. As a result, the state current signal, Istate, 404, 408 has one or more current states with little or no change with time, temperature, or other factors.

It should be apparent that a lowest current state value of the state current signal, Istate, 404, 408 should be greater than a highest current value of the variable current, Ivar, 412a, 414b of the electronic circuit portion 414. The current and voltage control circuit 412 should maintain a margin current above the highest current value of the variable current, Ivar, 412a. For example, in an illustrative but non-limiting example, the highest current value of the variable current, Ivar, 412a, 414b is about six milliamps and a value of the shunt current, Ishunt, 412b, is about one milliamp. The shunt current, Ishunt, 412b is controlled such that a sum of the shunt current, Ishunt, 412b plus the variable current, Ivar 412a, 414b is constant (i.e., relatively invariant). The sum is the same as the state current signal, Istate, 414, 408. In this illustrative example, the value of the shunt current, Ishunt, 412b is variable and maintained near one milliamp but such that a total lowest current value of the state current signal, Istate, 404, 408 is controlled at seven milliamps. In this example, the functional electronic circuit portion 414 consumes a bit less than the seven milliamps.

Figure 5:
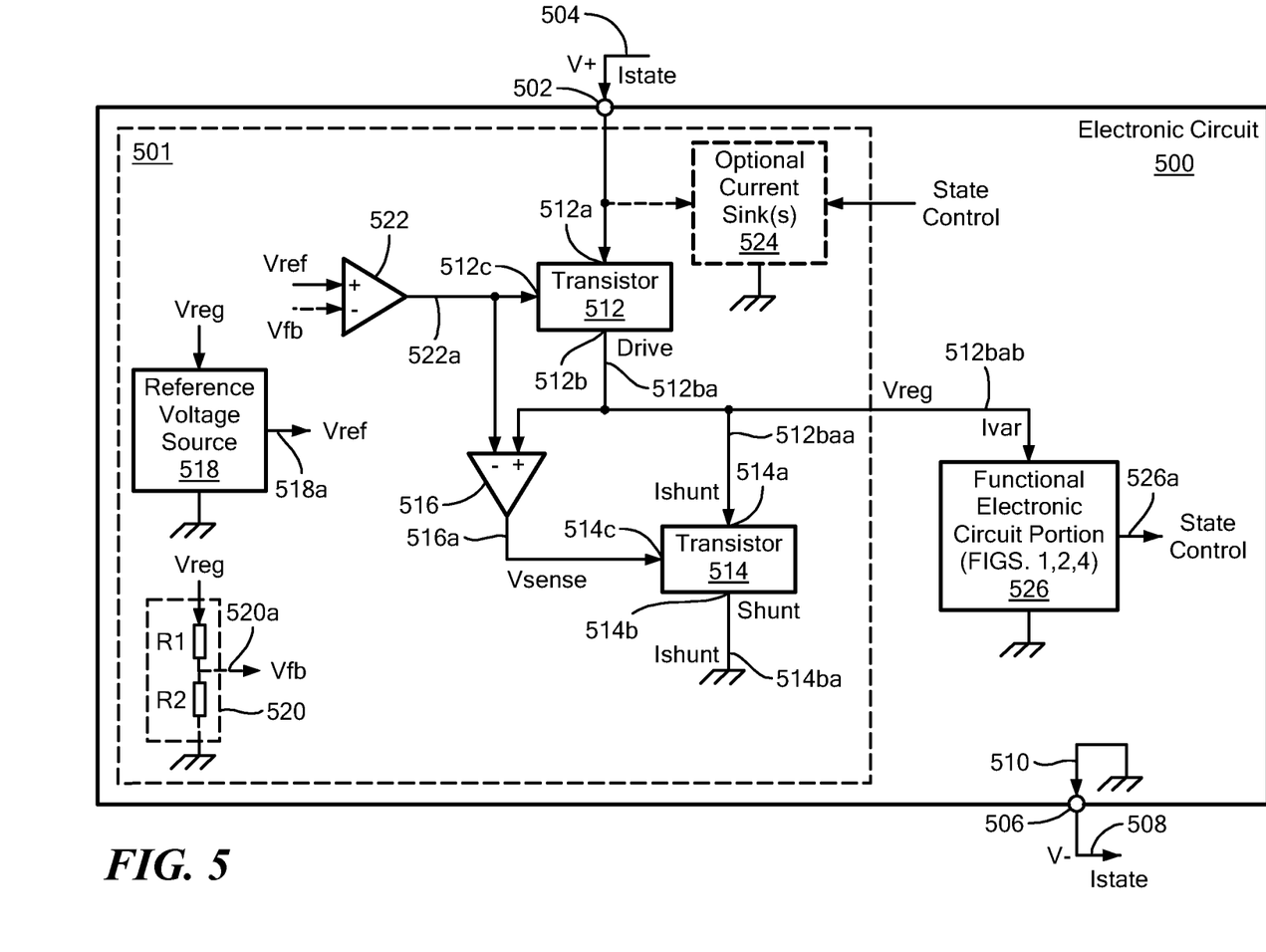
FIG. 5 is another block diagram showing an illustrative two-wire electronic circuit having a voltage sensing circuit to sense a voltage across two terminals of a transistor used in the two-wire electronic circuit, the voltage sensing circuit and transistor forming parts of the current and voltage control circuit of FIG. 4.

Referring now to FIG. 5, a two-wire electronic circuit 500 can include a functional electronic circuit portion 526, which can be the same as or similar to the functional electronic circuit portion 414 of FIG. 4. The two-wire electronic circuit 500 can also include a current and voltage control circuit 501, which can be the same as or similar to the current and voltage control circuit 412 of FIG. 4. The two-wire electronic circuit 500 can be disposed upon a major surface of a semiconductor substrate.

The functional electronic circuit portion 526 can be operable to generate a state control signal 526a, which can be the same as or similar to the state control signal 414a of FIG. 4. In response to the state control signal 526a, a state current signal, Istate, 504, 508 can have one or more current values (see, e.g., signal 312 of FIG. 3.)

The current and voltage control circuit 501 can include an electrical current receiving node 502, the electrical current receiving node 502 operable to receive the state current signal, Istate, 504 from outside of the electronic circuit 500. The current and voltage control circuit 501 can also include an electrical current transmitting node 506, the electrical current transmitting node 506 operable to transmit the state current signal, Istate, 508 to outside of the electronic circuit. The current and voltage control circuit 501 can also include a first transistor 512 having first and second electrical current passing nodes 512a, 512b, respectively, and operable to pass a first electrical current 512ba between the first and second electrical current passing nodes 512a, 512b of the first transistor 512. The first transistor 512 can also have a control node 512c operable to control the first electrical current 512ba. The first electrical current passing node 512a of the first transistor 512 can be coupled to the electrical current receiving node 502. The current and voltage control circuit 501 can also include a voltage reference source 518 operable to generate a predetermined reference voltage, Vref, 518a. The control node 512c of the first transistor 512 can be coupled to receive a voltage related to the predetermined reference voltage 518a. The current and voltage control circuit 501 can be operable to provide a regulated voltage, Vreg, at the second electrical current passing node 512b of the first transistor 512.

In some embodiments, the predetermined reference voltage, Vref, 518a is directly coupled to the control nod 512c of the first transistor 512. However, in other embodiments, the current and voltage control circuit 501 can also include a differential amplifier 522 having first and second inputs nodes and an output node, wherein the first input node of the differential amplifier 522 is coupled to the predetermined reference voltage, Vref, 518a, the second input node of the differential amplifier is coupled to a signal related to the regulated voltage, Vreg, at the second current passing node 512b of the first transistor, and the output node of the differential amplifier 522 is coupled to the control node 512c of the first transistor 512.

The current and voltage control circuit 501 can also include a second transistor 514 having first and second electrical current passing nodes 514a, 514b, respectively, and operable to pass a second electrical current 512baa, 514ba (a shunt current, Ishunt) between the first and second electrical current passing nodes 514a, 514b of the second transistor 514. The second transistor 514 also has a control node 514c operable to control the second electrical current 514ba. The second electrical current passing node 512b of the first transistor 512 is coupled to the first electrical current passing node 514a of the second transistor 514. The second electrical current passing node 514b of the second transistor 514 is coupled to the electrical current transmitting node 506.

The current and voltage control circuit 501 can also include a voltage sensing circuit 516 having first and second input nodes and an output node. Here, the voltage sensing circuit 516 is shown as a differential amplifier. However, it should be appreciated the voltage sensing circuit 516 can further include other circuits, for example, a DC level shifting circuit (not shown).

A voltage at the output node of the voltage sensing circuit 516 can be indicative of a voltage difference between the first and second input nodes of the voltage sensing circuit 516. The first input node of the voltage sensing circuit 516 can be coupled to the control node 512c of the first transistor 512. The second input node of the voltage sensing circuit 516 can be coupled to the second electrical current passing node 512b of the first transistor 512. The output node of the voltage sensing circuit 516 can be coupled to the control node 514c of the second transistor 514.

The two-wire electronic circuit 500 can also include the functional electronic circuit portion 526 coupled to the second electrical current passing node 512c of the first transistor 512. The functional electronic circuit portion 526 is operable to use a circuit portion electrical current 512bab having a circuit portion voltage, i.e., the regulated voltage, Vreg. The first electrical current 512ba includes both the second electrical current 512baa and the circuit portion electrical current 512bab. The two-wire electronic circuit 500 is operable to control the second electrical current 512baa, 514ba to maintain a predetermined sum of the second electrical current 512baa, 514ba and the circuit portion electrical current 512bab.

In some embodiments, a circuit 520 can be coupled to the regulated voltage, Vreg, and can be operable to generate a feedback voltage 520a received by the second input node of the differential amplifier 522.

It should be appreciated that the current and voltage control circuit 501 can include two feedback loops. In a first feedback loop, a current control feedback loop, the voltage sensing circuit 516 can sense a voltage between the control node 512c and the second current passing node 512b of the first transistor 512 and adjust the second electrical current 512baa, 514ba in accordance with the sensed voltage. A sensed voltage that is too high is indicative of a higher circuit portion electrical current 512bab used by the functional electronic circuit portion 526, which results in the second electrical current 512baa, 514ba being reduced to maintain a constant (relatively invariant) sum of the circuit portion electrical current 512bab and the second electrical current 512baa, which sum is similar to the state current signal 504, 508.

In a second feedback loop, the regulated voltage, Vreg, can be sensed in relation to the reference voltage 518a by the differential amplifier 522. If the regulated voltage, Vreg, is too high, a signal at the output node of the differential amplifier 522 and at the control node 512c of the first transistor 512 can adjusted lower in accordance with the sensed regulated voltage, Vreg.

It is advantageous to have the relatively invariant sum of the circuit portion electrical current 512bab and the second electrical current 512baa (which sum is similar to the state current signal 504, 508) be a lowest controlled electrical current only slightly above the circuit portion electrical current 512bab. With such an arrangement, in some embodiments, the current and voltage control circuit 501 can include one or more optional current generators 524, here current sinks, having an input node coupled to receive the state control signal 526a. Referring to signal 312 of FIG. 3, the lowest constant sum of the circuit portion electrical current 512bab and the second electrical current 512baa can be like the lowest current state, Ilow, and current states Ihigh1 and Ihigh2 can result when a first and a second optional current generators 524 are activated by the state control signal 526a. Because the lowest current state, Ilow, is controlled to be constant and relatively invariant, the other states, e.g., Ihigh1, Ihigh2, will be constant and relatively invariant.

Figure 6:
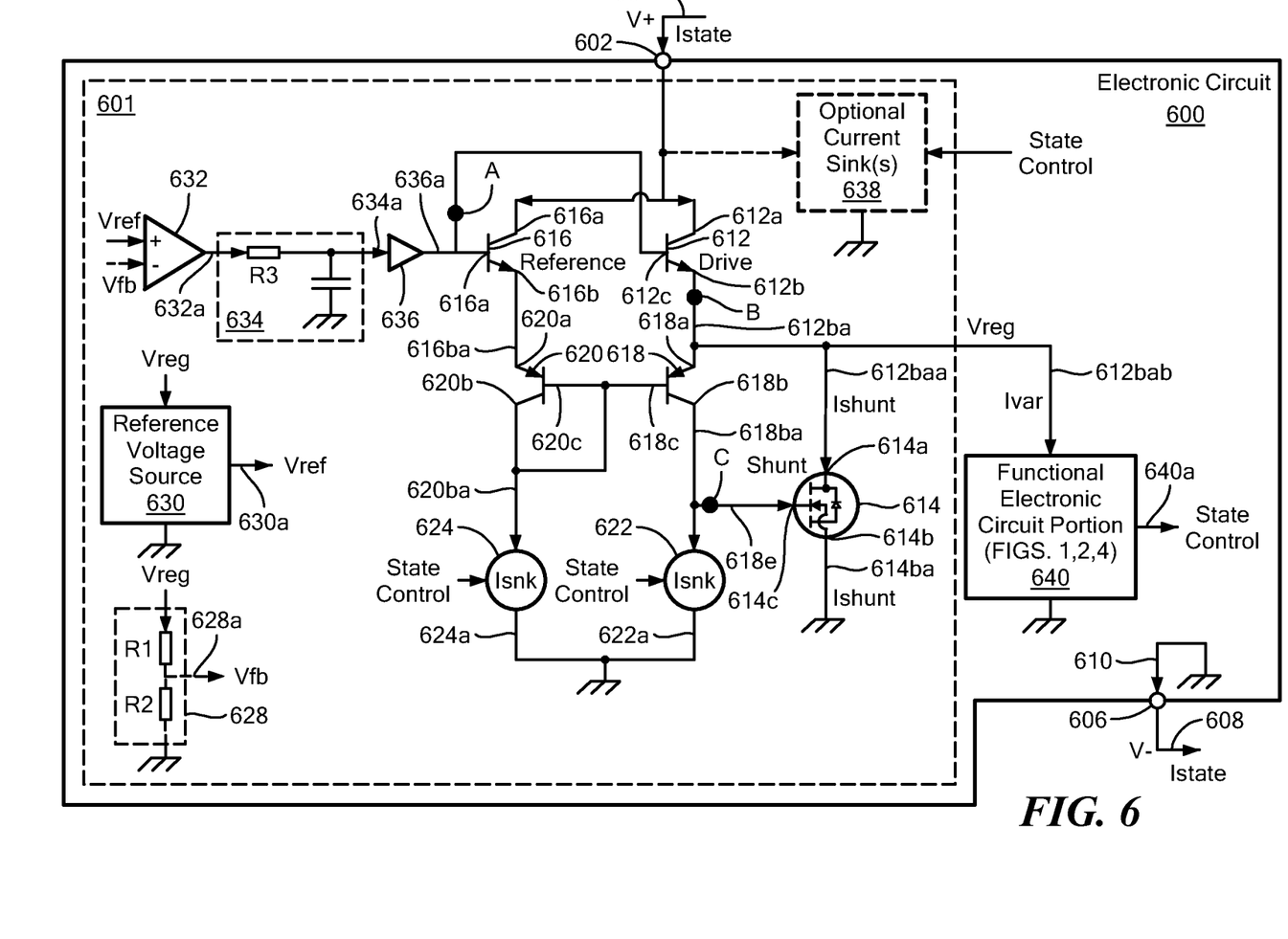
FIG. 6 is another block diagram showing an illustrative two-wire electronic circuit showing an illustrative voltage sensing circuit of FIG. 5.

Referring now to FIG. 6, a two-wire electronic circuit 600 can include a functional electronic circuit portion 640, which can be the same as or similar to the functional electronic circuit portion 414 of FIG. 4. The two-wire electronic circuit 600 can also include a current and voltage control circuit 601, which can be the same as or similar to the current and voltage control circuit 412 of FIG. 4. The two-wire electronic circuit 600 can be disposed upon a major surface of a semiconductor substrate.

The functional electronic circuit portion 640 can be operable to generate a state control signal 640a, which can be the same as or similar to the state control signal 414a of FIG. 4. In response to the state control signal 640a, a state current signal 604, 608 can have one or more current values (see, e.g., signal 312 of FIG. 3.)

The current and voltage control circuit 601 can include an electrical current receiving node 602, the electrical current receiving node 602 operable to receive the state current signal 604 from outside of the electronic circuit 600. The current and voltage control circuit 601 can also include an electrical current transmitting node 606, the electrical current transmitting node 606 operable to transmit the state current signal 608 to outside of the electronic circuit. The current and voltage control circuit 601 can also include a first transistor 612 having first and second electrical current passing nodes 612a, 612b, respectively, and operable to pass a first electrical current 612ba between the first and second electrical current passing nodes 612a, 612b of the first transistor 612. The first transistor 612 can also have a control node 612c operable to control the first electrical current 612ba. The first electrical current passing node 612a of the first transistor 612 can be coupled to the electrical current receiving node 602. The current and voltage control circuit 601 can also include a voltage reference source 630 operable to generate a predetermined reference voltage, Vref, 630a. The control node 612c of the first transistor 612 is coupled to receive a voltage related to the predetermined reference voltage, Vref, 618a. The current and voltage control circuit 601 can be operable to provide a regulated voltage, Vreg, at the second electrical current passing node 612b of the first transistor 612.

In some embodiments, the predetermined reference voltage 630a is directly coupled to the control nod 612c of the first transistor 612. However, in other embodiments, the current and voltage control circuit 601 can also include a differential amplifier 632 having first and second inputs nodes and an output node, wherein the first input node of the differential amplifier 632 is coupled to the predetermined reference voltage, Vref, 630a, the second input node of the differential amplifier is coupled to a signal related to the regulated voltage, Vreg, at the second current passing node 612b of the first transistor, and the output node of the differential amplifier 632 is coupled to the control node 612c of the first transistor 612.

The current and voltage control circuit 601 can also include a second transistor 614 having first and second electrical current passing nodes 614a, 614b, respectively, and operable to pass a second electrical current 612baa, 614ba (a shunt current, Ishunt) between the first and second electrical current passing nodes 614a, 614b of the second transistor 614. The second transistor also has a control node 614c operable to control the second electrical current 614ba. The second electrical current passing node 612b of the first transistor 612 is coupled to the first electrical current passing node 614a of the second transistor 614. The second electrical current passing node 614b of the second transistor 614 is coupled to the electrical current transmitting node 606.

The first and second transistors 612, 614, respectively, can be the same as or similar to the first and second transistors 512, 514, respectively, of FIG. 5.

The current and voltage control circuit 601 can also include a voltage sensing circuit like the voltage sensing circuit 516 of FIG. 5. Here, however, an illustrative voltage sensing circuit can include a third transistor 616 having first and second electrical current passing nodes 616a, 616b, respectively and operable to pass a third electrical current 616ba between the first and second electrical current passing nodes 616a, 616b of the third transistor 616. The third transistor 616 also has a control node 616c. The first electrical current passing node 612a of the first transistor 612 is coupled to the first electrical current passing node 616a of the third transistor 616. The control node 616c of the third transistor 616 is coupled to the control node 612c of the first transistor 612.

The illustrative voltage sensing circuit can also include a fourth transistor 618 having first and second electrical current passing nodes 618a, 618b, respectively, and operable to pass a fourth electrical current 618ba between the first and second electrical current passing nodes 618a, 618b of the fourth transistor 618. The fourth transistor 618 also has a control node 618c. The first electrical current passing node 618a of the fourth transistor 618 is coupled to the second electrical current passing node 612b of the first transistor 612.

The illustrative voltage sensing circuit can also include a fifth transistor 620 having first and second electrical current passing nodes 620a, 620b, respectively, and operable to pass a fifth electrical current 620ba between the first and second electrical current passing nodes 620a, 620b of the fifth transistor 620. The fifth transistor 620 also has a control node 620c. The first electrical current passing node 620a of the fifth transistor 620 is coupled to the second electrical current passing node 616b of the third transistor 616. The second electrical current passing node 620b of the fifth transistor 620 is coupled to the control nodes 618c, 620c of the fourth and fifth transistors, 618, 620. The second electrical current passing node 618b of the fourth transistor 618 is coupled to the control node 614c of the second transistor 614.

A voltage 618e at the output node of the voltage sensing circuit can be indicative of a voltage difference between input nodes of the voltage sensing circuit, i.e., a base-emitter voltage of the first transistor 612. Referring to the voltage sensing circuit 516 of FIG. 5, the first input node of the voltage sensing circuit (e.g., 516 of FIG. 5) can be coupled to the control node 612c of the first transistor 612, i.e., at a point labeled A in FIG. 6. The second input node of the voltage sensing circuit (e.g., 516 of FIG. 5) can be coupled to the second electrical current passing node 612b of the first transistor 612, i.e., at a point labeled B in FIG. 6. The output node of the voltage sensing circuit (e.g., 516 of FIG. 5) can be coupled to the control node 614c of the second transistor 614, i.e., at a point labeled C in FIG. 6.

To further clarify operation of the differential amplifier of FIG. 6 in relation to the differential amplifier 516 of FIG. 5, the third transistor 616 can be operable to generate a reference base-emitter voltage by passing a known current generated by the current generator 626. The fourth and fifth transistors 618, 620 operate as a base coupled pair, operable to generate a voltage at the node C that is related to a difference between a base-emitter voltage of the first transistor 612 and the base-emitter voltage (reference) of the third transistor 616.

Scaling of relative physical sizes of the first and third transistors 612, 616 and scaling of electrical currents passing through the first and third transistors 612, 616 is described below. However, let it suffice here to say that the third transistor 616 can be made smaller than the first transistor 612, and an electrical current passing through the third transistor 616 can made to be smaller than an electrical current passing through the first transistor 612, resulting in the same or similar base-emitter voltages of the first and third transistors 612, 616, respectively.

Other differential arrangements are also possible that could provide the differential amplifier 516 of FIG. 5.

The two-wire electronic circuit 600 can also include the functional electronic circuit portion 640 coupled to the second electrical current passing node 612c of the first transistor 612. The functional electronic circuit portion 640 is operable to use a circuit portion electrical current 612bab having a circuit portion voltage, i.e., the regulated voltage, Vreg. The first electrical current 612ba includes both the second electrical current 612baa and the circuit portion electrical current 612bab. The two-wire electronic circuit 600 is operable to control the second electrical current 612baa, 614ba to maintain a predetermined sum of the second electrical current 612baa, 614ba and the circuit portion electrical current 612bab.

The first transistor 612 has a first transistor area parallel to the major surface of the semiconductor substrate. The third transistor 616 has a third transistor area parallel to the major surface of the semiconductor substrate. In some embodiments, the third transistor area is substantially smaller than the first transistor area. In some embodiments, the third transistor area is between one fiftieth and one two hundredth of the first transistor area. In some embodiments, the third transistor area is about one hundredth of the first transistor area.

In some embodiments, the voltage sensing circuit further includes a first electrical current generator 622 coupled between the second electrical current passing node 618b of the fourth transistor 618 and the electrical current transmitting node 616, and a second electrical current generator 624 coupled between the second electrical current passing node 620b of the fifth transistor 620 and the electrical current transmitting node 606.

In some embodiments, the first electrical current generator 622 is operable to generate the fourth electrical current 618ba, 622a of between one fiftieth and one two hundredth of the first electrical current 612ba, and the second electrical current generator 624 is operable to generate the fifth electrical current 620ba, 624a of between one fiftieth and one two hundredth of the first electrical current. In some embodiments the first electrical current generator 622 is operable to generate the fourth electrical current 618*ba*, 622*a* of one one-hundredth of the first electrical current 612*ba*, and the second electrical current generator 624 is operable to generate the fifth electrical current 620*ba*, 624*a* of about one one-hundredth of the first electrical current 612*a*.

Providing the third transistor 616 with a smaller area than the first transistor 612, for example, in a ratio of 1:100, results in the same base-emitter voltage of the third transistor 616 when the third transistor 616 experiences a smaller electrical current than the first transistor 612, for example, one one-hundredth the current. Thus, for an area ratio of 1:100, when the electrical current passing between the first and second current passing terminals 616*a*, 616*b* of the third transistor 616 is set by the second electrical current generator 624 to be, for example, seventy microamps, the third transistor 616 has the same base-emitter voltage as the first transistor 612 when passing seven milliamps. In an example described above, seven milliamps is used as the electrical current used by the two-wire electronic circuit 600, and thus a bit less than seven milliamps is used by the functional electronic circuit portion 640.

In some embodiments, the first electrical current generator 622 has a current control node at which the state control signal 640*a* is received from the functional electronic circuit portion 640. The state control signal 640*a* has at least two states and the first electrical current generator 622 is operable to generate the fourth electrical current 618*ba*, 632*a* having at least two respective predetermined electrical current values in response to the state control signal 640*a*.

Similarly, in some embodiments, the second electrical current generator 624 has a current control node at which the state control signal 640*a* is received from the functional electronic circuit portion 640. The second electrical current generator 624 is operable to generate the fifth electrical current 620*ba*, 624*a* having at least two respective predetermined electrical current values in response to the state control signal 640*a*.

In some embodiments, a circuit 628 can be coupled to the regulated voltage, Vreg, and can be operable to generate a feedback voltage 628*a* received by the second input node of the differential amplifier 632.

In some embodiments, a filter 634, here shown as an RC filter, can be coupled between the output node of the differential amplifier 632 and the control nodes 612*c*, 616*c* of the first and third transistors 612, 616.

In some embodiments, a buffer amplifier 636 can be coupled between the filter 634 and the control nodes 612*c*, 616*c* of the first and third transistors 612, 616.

It should be appreciated that the current and voltage control circuit can include two feedback loops. In a first feedback loop, a current control feedback loop, the voltage sensing circuit can sense a voltage (e.g., a base-emitter voltage) between the control node 612*c* and the second current passing node 612*b* of the first transistor 612 and adjust the second electrical current 612*baa*, 614*ba* in accordance with the sensed voltage. A sensed voltage that is too high is indicative of a higher circuit portion electrical current 612*bab* used by the functional electronic circuit portion 640, which results in the second electrical current 612*baa*, 614*ba* being reduced to maintain a constant (relatively invariant) sensed voltage and constant (relatively invariant) sum of the circuit portion electrical current 612*bab* and the second electrical current 612*baa*, which sum is similar to the state current signal 604, 608.

In a second feedback loop, the regulated voltage, Vreg, can be sensed in relation to the reference voltage 630*a* by the differential amplifier 632. If the regulated voltage, Vreg, is too high, a signal at the output node of the differential amplifier 632 and at the control node 612*a* of the first transistor 612 can be adjusted lower in accordance with the sensed regulated voltage, Vreg.

It is advantageous to have the relatively invariant sum of the circuit portion electrical current 612*bab* and the second electrical current 612*baa* (which sum is similar to the state current signal 604, 608) be a lowest controlled electrical current only slightly above the circuit portion electrical current 612*bab*. With such an arrangement, the current and voltage control circuit 601 can include one or more optional current generators 638, here current sinks, having an input node coupled to receive the state control signal 640*a*. Referring to signal 312 of FIG. 3, the lowest constant sum of the circuit portion electrical current 612*bab* and the second electrical current 612*baa* can be like the lowest current state, Ilow, and current states Ihigh1 and Ihigh2 can result when a first and a second optional current generators 638 are activated by the state control signal 640*a*, and/or when current values of the first and second electrical current generators 622, 624 are changed by the state control signal 640*a*. Because the lowest current state, Ilow, is controlled to be constant or relatively invariant, the other states, e.g., Ihigh1, Ihigh2, will be constant and relatively invariant.

While transistors are shown to be bipolar junction transistors (BJTs) in some instances and field effect transistors (FETs) in other instances, in other embodiments, any BJT can be replaced with a FET. Furthermore, any FET can be replaced with a BJT.

In accordance with the two-wire electronic circuits of FIGS. 4-6, a method used in an electronic circuit disposed upon a semiconductor substrate can include: receiving, from outside of the electronic circuit, at an a electrical current receiving node, a state current signal; transmitting, to outside of the electronic circuit, from an electrical current transmitting node, the state current signal; conducting, through a first transistor, a first electrical current, the first electrical current being at least a portion of the state current signal; measuring a voltage difference between two nodes of the first transistor; conducting, in accordance with the voltage difference, through a second transistor, a second electrical current, the second electrical current being a first portion of the first electrical current; and conducting, to a portion of the electronic circuit, a circuit portion electrical current, the circuit portion electrical current being a second portion of the first electrical current, wherein a sum of the second electrical current and the circuit portion electrical current is a regulated electrical current having one or more predetermined electrical current values.

In accordance with the two-wire electronic circuits of FIGS. 4-6, a two-wire electronic circuit can include means for: receiving, from outside of the electronic circuit, at an a electrical current receiving node, a state current signal; means for transmitting, to outside of the electronic circuit, from an electrical current transmitting node, the state current signal; means for conducting, through a first transistor, a first electrical current, the first electrical current being at least a portion of the state current signal; means for measuring a voltage difference between two nodes of the first transistor; means for conducting, in accordance with the voltage difference, through a second transistor, a second electrical current, the second electrical current being a first portion of the first electrical current; and means for conducting, to a portion of the electronic circuit, a circuit portion electrical current, the circuit portion electrical current being a second portion of the first electrical current, wherein a sum of the second electrical current and the circuit portion electrical current is a regulated electrical current having one or more predetermined electrical current values.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic circuit disposed upon a major surface of a semiconductor substrate, comprising:
   an electrical current receiving node, the electrical current receiving node operable to receive a state current signal from outside of the electronic circuit;
   an electrical current transmitting node, the electrical current transmitting node operable to transmit the state current signal to outside of the electronic circuit;
   a first transistor having first and second electrical current passing nodes and operable to pass a first electrical current between the first and second electrical current passing nodes of the first transistor, the first transistor also having a control node operable to control the first electrical current, and the first electrical current passing node of the first transistor coupled to the electrical current receiving node;
   a voltage reference source operable to generate a predetermined reference voltage, wherein the control node of the first transistor is coupled to receive a voltage related to the predetermined reference voltage;
   a second transistor having first and second electrical current passing nodes and operable to pass a second electrical current between the first and second electrical current passing nodes of the second transistor, the second transistor also having a control node operable to control the second electrical current, the second electrical current passing node of the first transistor coupled to the first electrical current passing node of the second transistor, and the second electrical current passing node of the second transistor coupled to the electrical current transmitting node;
   a voltage sensing circuit first and second input nodes and an output node, a voltage at the output node indicative of a voltage difference between the first and second input nodes, the first input node of the voltage sensing circuit coupled to the control node of the first transistor, the second input node of the voltage sensing circuit coupled to the second electrical current passing node of the first transistor, and the output node of the voltage sensing circuit coupled to the control node of the second transistor; and
   a portion of the electronic circuit coupled to the second electrical current passing node of the first transistor, wherein the portion of the electronic circuit is operable to use a circuit portion electrical current having a circuit portion voltage, wherein the first electrical current includes both the second electrical current and the circuit portion electrical current, wherein the electronic circuit is operable to control the second electrical current to maintain a predetermined sum of the second electrical current and the circuit portion electrical current.

2. The electronic circuit of claim 1, wherein the voltage sensing circuit comprises:
   a third transistor having first and second electrical current passing nodes and operable to pass a third electrical current between the first and second electrical current passing nodes of the third transistor, the third transistor also having a control node, wherein the first electrical current passing node of the first transistor is coupled to the first electrical current passing node of the third transistor, and wherein the control node of the third transistor is coupled to the control node of the first transistor;
   a fourth transistor having first and second electrical current passing nodes and operable to pass a fourth electrical current between the first and second electrical current passing nodes of the fourth transistor, the fourth transistor also having a control node, and wherein the first electrical current passing node of the fourth transistor is coupled to the second electrical current passing node of the first transistor; and
   a fifth transistor having first and second electrical current passing nodes and operable to pass a fifth electrical current between the first and second electrical current passing nodes of the fifth transistor, the fifth transistor also having a control node, wherein the first electrical current passing node of the fifth transistor is coupled to the second electrical current passing node of the third transistor, wherein the second electrical current passing node of the fifth transistor is coupled to the control nodes of the fourth and fifth transistors, and wherein the second electrical current passing node of the fourth transistor is coupled to the control node of the second transistor.

3. The electronic circuit of claim 2, wherein the first transistor comprises a first transistor area parallel to the major surface of the semiconductor substrate, wherein the third transistor comprises a third transistor area parallel to the major surface of the semiconductor substrate, wherein the third transistor area is substantially smaller than the first transistor area.

4. The electronic circuit of claim 3, wherein the third transistor area is between one fiftieth and one two hundredth of the first transistor area.

5. The electronic circuit of claim 2, wherein the voltage sensing circuit further comprises:
   a first electrical current generator coupled between the second electrical current passing node of the fourth transistor and the electrical current transmitting node; and
   a second electrical current generator coupled between the second electrical current passing node of the fifth transistor and the electrical current transmitting node.

6. The electronic circuit of claim 5, wherein the first electrical current generator is operable to generate the fourth electrical current of between one fiftieth and one two hundredth of the first electrical current, and wherein the second electrical current generator is operable to generate the fifth electrical current of between one fiftieth and one two hundredth of the first electrical current.

7. The electronic circuit of claim 5, wherein the first transistor comprises a first transistor area parallel to the major surface of the semiconductor substrate, wherein the third transistor comprises a third transistor area parallel to the major surface of the semiconductor substrate, wherein the third transistor area is substantially smaller than the first transistor area.

8. The electronic circuit of claim 7, wherein the third transistor area is between one fiftieth and one two hundredth of the first transistor area.

9. The electronic circuit of claim 5, wherein,
the first electrical current generator comprises:
a current control node at which a state control signal is received from the portion of the electronic circuit, wherein the state control signal has at least two states and the first electrical current generator is operable to generate the fourth electrical current having at least two respective predetermined electrical current values in response to the state control signal; and
the second electrical current generator comprises:
a current control node at which the state control signal is received from the portion of the electronic circuit, wherein the second electrical current generator is operable to generate the fifth electrical current having at least two respective predetermined electrical current values in response to the state control signal.

10. The electronic circuit of claim 1, wherein the second transistor is operable to generate the second electrical current as a shunt electrical current such that a sum or the shunt electrical current and the circuit portion electrical current is a regulated electrical current having one or more predetermined electrical current values.

11. The electronic circuit of claim 1, further comprising:
at least one electrical current generator coupled between the electrical current receiving node and the electrical current transmitting node, the at least one electrical current generator having a respective a least one control node at which a state control signal is received from the portion of the electronic circuit, wherein the at least one electrical current generator is operable to generate at least one electrical current between the electrical current receiving node and the electrical current transmitting node in response to the state control signal.

12. The electronic circuit of claim 1, further comprising:
a feedback circuit coupled between the second electrical current passing node of the first transistor and control node of the first transistor.

13. The electronic circuit of claim 1, wherein the electronic circuit is operable to provide a regulated voltage at the second electrical current passing node of the first transistor, wherein the electronic circuit further comprises:
a differential amplifier having first and second inputs nodes and an output node, the first input node of the differential amplifier coupled to the predetermined reference voltage, the second input node of the differential amplifier coupled to a signal related to the regulated voltage, and the output node of the differential amplifier coupled to the control node of the first transistor.

14. The electronic circuit of claim 1, wherein at least one of the first, or second transistors is a bipolar transistor.

15. The electronic circuit of claim 1, wherein at least one of the first or second transistors is a field effect transistor.

16. A method used in an electronic circuit disposed upon a semiconductor substrate, the method comprising:
receiving, from outside of the electronic circuit, at an electrical current receiving node, a state current signal;
transmitting, to outside of the electronic circuit, from an electrical current transmitting node, the state current signal;
conducting, through a first transistor, a first electrical current, the first electrical current being at least a portion of the state current signal;
measuring a voltage difference between two nodes of the first transistor;
conducting, in accordance with the voltage difference, through a second transistor, a second electrical current, the second electrical current being a first portion of the first electrical current; and
conducting, to a portion of the electronic circuit, a circuit portion electrical current, the circuit portion electrical current being a second portion of the first electrical current, wherein a sum of the second electrical current and the circuit portion electrical current is a regulated electrical current having one or more predetermined electrical current values.

17. The method of claim 16, further comprising:
generating one or more other currents in the electronic circuit in accordance with the one or more predetermined electrical current values, the one or more predetermined current values indicative of one or more states, respectively.

18. The method of claim 16, further comprising:
generating a control signal with the portion of the electronic circuit, the control signal having at least two states; and
generating the regulated electrical current having at least two predetermined electrical current values in response to the at least two states.

19. An electronic circuit disposed upon a semiconductor substrate, comprising means for:
receiving, from outside of the electronic circuit, at an electrical current receiving node, a state current signal;
transmitting, to outside of the electronic circuit, from an electrical current transmitting node, the state current signal;
conducting, through a first transistor, a first electrical current, the first electrical current being at least a portion of the state current signal;
measuring a voltage difference between two nodes of the first transistor;
conducting, in accordance with the voltage difference, through a second transistor, a second electrical current, the second electrical current being a first portion of the first electrical current; and
conducting, to a portion of the electronic circuit, a circuit portion electrical current, the circuit portion electrical current being a second portion of the first electrical current, wherein a sum of the second electrical current and the circuit portion electrical current is a regulated electrical current having one or more predetermined electrical current values.

20. The electronic circuit of claim 19, further comprising means for:
generating one or more other currents in the electronic circuit in accordance with the one or more predetermined electrical current values, the one or more predetermined current values indicative of one or more states, respectively.

21. The electronic circuit of claim 19, further comprising means for:
generating a control signal with the portion of the electronic circuit, the control signal having at least two states; and generating the regulated electrical current having at least two predetermined electrical current values in response to the at least two states.

\* \* \* \* \*

UNITED STATES PATENT AND TRADEMARK OFFICE
CERTIFICATE OF CORRECTION

PATENT NO. : 11,770,322 B1
APPLICATION NO. : 17/661311
DATED : September 26, 2023
INVENTOR(S) : Leandro Fuentes et al.

It is certified that error appears in the above-identified patent and that said Letters Patent is hereby corrected as shown below:

In the Specification

Column 2, Line 52 delete "voltage reference" and replace with --a voltage reference--.

Column 6, Lines 9-10 delete "as used" and replace with --is used--.

Column 8, Line 7 delete "operable generate" and replace with --operable to generate--.

Column 9, Line 13 delete "signals" and replace with --signal--.

Column 9, Line 30 delete "include" and replace with --include a--.

Column 9, Line 52 delete "factor" and replace with --factors--.

Column 10, Line 51 delete "nod" and replace with --node--.

Column 10, Line 54 delete "inputs" and replace with --input--.

Column 11, Line 64 delete "can adjusted" and replace with --can be adjusted--.

Column 12, Line 60 delete "nod" and replace with --node--.

Column 12, Line 63 delete "inputs" and replace with --input--.

Column 14, Line 23 delete "can made" and replace with --can be made--.

Column 15, Line 24 delete "has          a current" and replace with --has a current--.

Signed and Sealed this
Eighth Day of October, 2024

Katherine Kelly Vidal
*Director of the United States Patent and Trademark Office*

In the Claims

Column 17, Line 53 delete "circuit first" and replace with --circuit having first--.

Column 19, Line 27 delete "sum or" and replace with --sum of--.

Column 19, Line 35 delete "a least" and replace with --at least--.

Column 19, Line 50 delete "inputs" and replace with --input--.